(12) United States Patent
Klenkler et al.

(10) Patent No.: US 9,012,772 B2
(45) Date of Patent: Apr. 21, 2015

(54) PHOTOVOLTAIC DEVICE

(75) Inventors: Richard A. Klenkler, Oakville (CA);
Avery P. Yuen, Mississauga (CA);
Nathan M. Bamsey, Burlington (CA)

(73) Assignee: Xerox Corporation, Norwalk, CT (US)

( * ) Notice: Subject to any disclaimer, the term of this patent is extended or adjusted under 35 U.S.C. 154(b) by 959 days.

(21) Appl. No.: 12/910,005

(22) Filed: Oct. 22, 2010

(65) Prior Publication Data
US 2012/0097249 A1     Apr. 26, 2012

(51) Int. Cl.
*H01L 31/00* (2006.01)
*H01L 51/42* (2006.01)
*B82Y 10/00* (2011.01)
*H01L 51/00* (2006.01)

(52) U.S. Cl.
CPC .............. *H01L 51/424* (2013.01); *B82Y 10/00* (2013.01); *H01L 51/001* (2013.01); *H01L 51/0029* (2013.01); *H01L 51/0046* (2013.01); *H01L 51/0078* (2013.01); *H01L 51/0079* (2013.01); *Y02E 10/549* (2013.01)

(58) Field of Classification Search
CPC ............ H01L 51/0078; H01L 51/0079; H01L 51/424
USPC ........................................................ 136/263
See application file for complete search history.

(56) References Cited

U.S. PATENT DOCUMENTS

| | | | |
|---|---|---|---|
| 3,293,075 A | 12/1966 | Wildi | |
| 4,175,981 A | 11/1979 | Loutfy et al. | |
| 4,175,982 A | 11/1979 | Loutfy et al. | |
| 4,471,039 A | 9/1984 | Borsenberger et al. | |
| 6,335,480 B1 * | 1/2002 | Bach et al. | 136/263 |
| 7,772,487 B1 | 8/2010 | Robinson | |
| 7,955,889 B1 * | 6/2011 | Yang et al. | 438/82 |
| 2002/0189666 A1 * | 12/2002 | Forrest et al. | 136/263 |
| 2005/0005964 A1 * | 1/2005 | Komatsu | 136/263 |
| 2007/0181179 A1 * | 8/2007 | Brabec et al. | 136/263 |
| 2008/0012005 A1 * | 1/2008 | Yang et al. | 257/40 |
| 2008/0163927 A1 * | 7/2008 | Sohn et al. | 136/263 |
| 2009/0165857 A1 | 7/2009 | Naito et al. | |
| 2009/0217980 A1 * | 9/2009 | Pfeiffer et al. | 136/263 |
| 2009/0229670 A1 | 9/2009 | Kitamura et al. | |

FOREIGN PATENT DOCUMENTS

JP         05-129643      *    5/1993
WO       2009/056626 A1        5/2009

OTHER PUBLICATIONS

Machine translation of JP05-129643, pub. May 1993.*
Hor et al., "Photovoltaic properties of cadmium sulfide/trivalent-metal phthalocyanine heterojunction devices," Appl. Phys. Lett. 42(2). Jan. 15, 1983, p. 165-167.

(Continued)

*Primary Examiner* — Allison Bourke
(74) *Attorney, Agent, or Firm* — Fay Sharpe LLP

(57) ABSTRACT

A photovoltaic device is disclosed. The photovoltaic device includes a substrate, an anode, a cathode, and a semiconducting bilayer. The bilayer is composed of a first continuous sublayer and a second continuous sublayer. The first sublayer includes a first polymorph of a metallophthalocyanine. The second sublayer includes a second polymorph of the same metallophthalocyanine. The complementary absorption profiles of the polymorphs result in a device having greater absorption and efficiency, improving performance of the photovoltaic device.

17 Claims, 4 Drawing Sheets

(56) References Cited

OTHER PUBLICATIONS

Hor et al., "Solvent-Induced Dimorphic Transformation in Magnesium Phthalocyanine and Its Effect on the Photoactivity," Electronics and Optics, Thin Solid Films, 106(1983) p. 291-301.

Loutfy et al., "Electrophotographic Photoreceptors Incorporating Aggregated Phthalocyanines," Journal of Imaging Science 29: (116-121) (1985).

Loutfy et al., "Near-Infrared Photoreceptor Devices Incorporating Evaporated Chloroindium Phthalocyanine," Journal of Imaging Science 31: 31-37 (1987).

Yang et al., "Simultaneous heterojunction organic solar cells with broad spectral sensitivity," Appl. Phys. Letter 92. 053310 (2008) (3pp).

Rand et al., "Organic solar cells with sensitivity extending into the near infrared," Appl. Phys Letter 87, 233508 (2005) (3pp).

Kumar et al., "Broad spectral sensitivity and improved efficiency in CuPc/Sub-Pc organic photovoltaic devices," J. Phys. D: Appl. Phys. 42 (2009) 015103 (6pp).

Placencia et al., "Organic Photovoltaic Cells Based on Solvent-Annealed, Textured Titanyl Phthalocyanine/C60 Heterojunctions," Adv. Funct. Mater. 2009, 19, 1913-1921.

Zhang et al., "Simple tandem organic photovoltaic cells for improved energy conversion efficiency," Appl. Phys. Letter 92, 083310 (2008) (3pp).

Yuen et al., "Blend composition study of poly(3,3'''didodecylquaterthiophene)/[6,6]-phenyl C61 butyric acid methylester solution processed organic solar cells," Journal of Applied Physics 105, 016105 (2009) (3pp).

Koeppe et al., "Complexation of pyrrolldinofullerenes and zinc-phthalocyanine in a bilayer organic cell structure," Appl. Phys. Letter 87, 244102 (2005) (3pp).

Tackley et al., "Phthalocyanines: structure and vibrations," Phys. Chem. Chem. Phys., 2001, 3, (1419-1426).

Xue et al., "Asymmetric tandem organic photovoltaic cells with hybrid planar-mixed molecular heterojunctions," Appl. Phys. Letter, vol. 85, No. 23. Dec. 6, 2004 (5757-5759).

Tang, "Two-layer organic photovoltaic cell," Appl. Phys. Letter 48(2). Jan. 13, 1986 (183-185).

Brabec et al., "Origin of the Open Circuit Voltage of Plastic Solar Cells," Adv. Funct. Matter. 2001,11,No. 5, October (374-380).

Terao, "Correlation of hole mobility, exciton diffusion length, and solar cell characteristics in phthalocyanine/fullerene organic solar cells," Appl. Phys. Letter 90, 103515 (2007) (3pp).

Winder et al., "Low bandgap polymers for photon harvesting in bulk heterojuction solar cells," J. Mater. Chem., 2004, 14, 1077-1086.

Dennler et al., "Flexible Conjugated Polymer-Based Plastic Solar Cells: From Basics to Applications," Proceedings of the IEEE, vol. 93, No. 8, Aug. 2005 (1429-1439).

Shen et al., "Performance Improvement of TiO2/P3HT solar cells using CuPc as a sensitizer," Appl. Phys. Letter 92, 073307 (2008) (3pp).

Peumans et al., "Small molecular weight organic thin-film photodetectors and solar cells," Appl. Phys. vol. 93, No. 7, Apr. 1, 2003 (3693-3723).

Kazmerski, "Solar photovoltaics R&D at the tipping point: A 2005 technology overview," Journal of Electron Spectroscopy and Related Phenomena 150 (2006) (105-135).

Brabec et al, "Plastic Solar Cells" Adv. Funct. Mater. 2001, 11, No. 1, Feb. (15-26).

Tian et al., "Electrical transport properties of (CoxAl1-x)2O3-v oxide magnetic semiconductor and corresponding Co—Al2O3 granular films," Appl. Phys. Letter 91, 013509 (2007) (3pp).

Hagglund et al., "Electromagnetic coupling of light into a silion solar cell by nanodisk plasmons," Appl. Phys. Letter 92, 053110 (2008) (3pp).

Janssen et al., "Highly efficient organic tandem solar cells using an improved connecting architecture," Appl. Phys. Letters 91, 073519 (2007) (3pp).

Chan et al., "Doping-induced efficiency enhancement in organic photovoltaic devices," Appl. Phys. Letters 90, 023504 (2007) (3pp).

German Search Report and of German Application No. DE 10 2011 084 652.2, Dated Nov. 5, 2013. (No English Translation Provided).

* cited by examiner

PHOTOVOLTAIC DEVICE

BACKGROUND

The present disclosure relates to a photovoltaic device useful for generating an electrical current upon exposure to wide spectrum light, such as sunlight. The materials described herein can be used in organic solar cells.

A photovoltaic device typically contains a layer of a photoactive material sandwiched between two electrodes (i.e. a cathode and an anode). The photoactive layer can absorb the energy in a photon emitted by radiation, such as sunlight. This photon energy creates an exciton, or bound electron-hole pair. Depending on the material, the electron and hole can travel a short distance (on the order of several nanometers) before spontaneous recombination occurs. The exciton can move to a junction where they can be separated, so that electrons are collected at one electrode and holes are collected at the other electrode. This allows current to flow through an external circuit.

Such light absorption and charge generation is limited in organic photovoltaic devices. Organic semiconducting materials arouse interest due to their low-cost potential, light weight, and ease of processing. However, the materials typically used in organic solar cells do not optimally match the solar spectrum, resulting in a large fraction of the light energy passing through the device being lost (i.e. not converted into electrical current) and low power conversion efficiency. With over half of the total solar irradiance residing in wavelengths above 650 nm, capturing longer wavelengths in this near infrared (NIR) range of from about 650 nm to about 1000 nm is desirable.

One highly studied group of materials is that of metallophthalocyanines, which are a small molecule containing a metal atom at the center of a cyclic molecule. Metallophthalocyanines generally have a high absorption coefficient ($\alpha > 10^5$ cm$^{-1}$) and hole mobilities of around $10^{-3}$ cm$^2$/V·sec. They typically have a Q-band peak in the red to near-infrared wavelengths. However, they also have a relatively narrow absorption profile.

It would be desirable to provide a photovoltaic device that can capture more of the light energy present in sunlight and generate greater amounts of electricity, increasing the power conversion efficiency of the device.

BRIEF DESCRIPTION

Disclosed in various embodiments herein are photovoltaic devices that have an improved overall power conversion efficiency (PCE). Generally speaking, the photovoltaic devices include a first electrode (such as an anode), a semiconducting bilayer having two continuous sublayers, and a second electrode (such as a cathode). One sublayer comprises a metallophthalocyanine, and the other sublayer comprises a different polymorph of the same metallophthalocyanine.

Disclosed in further embodiments is a photovoltaic device, comprising: a substrate; an anode upon the substrate; a semiconducting bilayer including a first continuous sublayer contacting a second continuous sublayer; an electron transporting layer; and a cathode. The semiconducting bilayer is located between the anode and the cathode, with the first sublayer being closer in distance to the anode than the second sublayer. The electron transporting layer is located between the second sublayer and the cathode. The first sublayer comprises a first polymorph of a metallophthalocyanine. The second sublayer comprises a second polymorph of the metallophthalocyanine.

In embodiments, the metallophthalocyanine is of Formula (I):

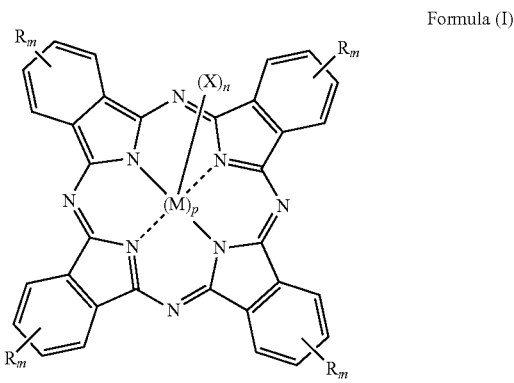

Formula (I)

wherein M is a divalent, trivalent or tetravalent metal atom; X is hydroxyl, oxygen, or halogen, and n is an integer from 0 to 2, or $(X)_n$ is $=$O; each m independent represents the number of R substituents on the phenyl ring, and is independently an integer from 0 to 6; each R is independently selected from the group consisting of halogen, alkyl, substituted alkyl, alkoxy, substituted alkoxy, phenoxy, phenylthio, aryl, substituted aryl, heteroaryl, —CN, and —NO$_2$; and p is 0 or 1.

In particular embodiments, the metallophthalocyanine is indium chloride phthalocyanine.

A junction between the first sublayer and the second sublayer of the semiconducting bilayer may have a surface roughness of from 1 nanometer to 6 nanometers.

The first electrode may comprise indium tin oxide, fluorine tin oxide, doped zinc oxide, PEDOT:PSS, carbon nanotube, or graphene.

The second electrode may comprise aluminum, silver, magnesium, calcium, or alloys thereof.

The electron transporting layer may comprise C$_{60}$ fullerene, [6,6]-phenyl-C$_{61}$-butyric acid methyl ester (PCBM), C$_{70}$ fullerene, [6,6]-phenyl-C$_{71}$-butyric acid methyl ester (PC[71]BM), or any other fullerene derivative.

The photovoltaic device may additionally comprise a hole blocking layer located between the electron transporting layer and the second electrode. The hole blocking layer may comprise bathocuproine, lithium fluoride, or bathophenanthroline.

The photovoltaic device may further comprise an electron blocking layer between the first electrode and the first sublayer of the semiconducting bilayer. The electron blocking layer may comprise poly(3,4-ethylenedioxythiophene):poly(styrene sulfonic acid) (PEDOT:PSS), MoO$_3$, or V$_2$O$_5$.

Also disclosed is a photovoltaic device, comprising in sequence: a substrate; an anode upon the substrate; a semiconducting bilayer composed of a first continuous sublayer contacting a second continuous sublayer, the first sublayer being closer to the anode than the second sublayer; an electron transporting layer upon the second sublayer; a hole blocking layer upon the electron transporting layer; and a cathode upon the hole blocking layer. The first sublayer comprises a first polymorph of a metallophthalocyanine. The second sublayer comprises a second polymorph of the metallophthalocyanine.

Further disclosed herein is a photovoltaic device, comprising in sequence: an optically transparent substrate; an indium tin oxide electrode upon the substrate; a first continuous semiconducting sublayer comprising a first polymorph of indium chloride metallophthalocyanine; a second continuous semiconducting sublayer comprising a second polymorph of indium chloride metallophthalocyanine; an electron transporting layer comprising $C_{60}$ fullerene; a hole blocking layer comprising bathocuproine; and an aluminum electrode deposited on the hole blocking layer.

These and other non-limiting aspects of the present disclosure are more particularly described below.

BRIEF DESCRIPTION OF THE DRAWINGS

The following is a brief description of the drawings, which are presented for the purpose of illustrating the exemplary embodiments disclosed herein and not for the purpose of limiting the same.

DETAILED DESCRIPTION

Figure 1:
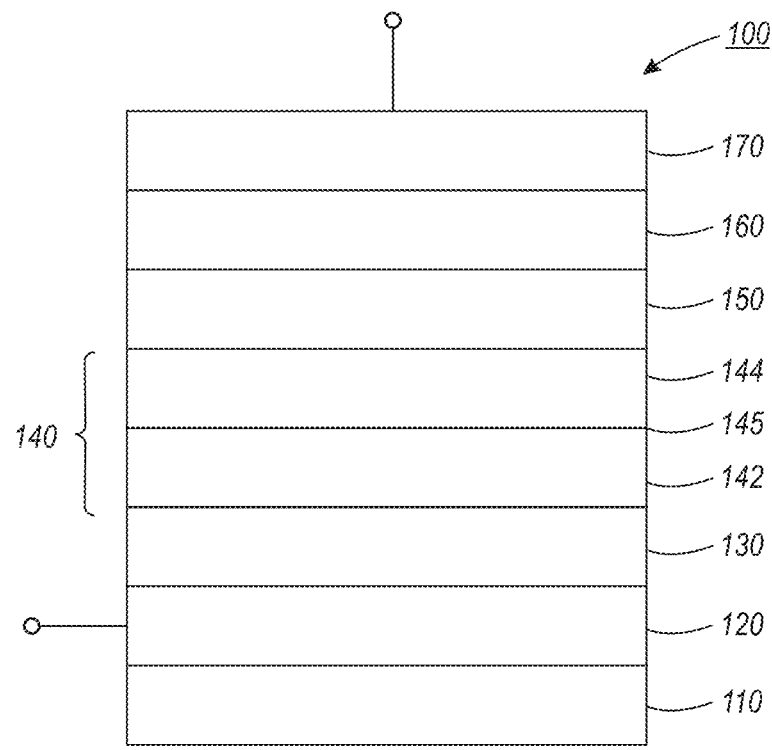
FIG. 1 is a cross-sectional view of an exemplary photovoltaic device of the present disclosure.

A more complete understanding of the components, processes, and apparatuses disclosed herein can be obtained by reference to the accompanying figures. These figures are merely schematic representations based on convenience and the ease of demonstrating the present development and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings and are not intended to define or limit the scope of the disclosure. In the drawings and the following description below, it is to be understood that like numeric designations refer to components of like function.

The modifier "about" used in connection with a quantity is inclusive of the stated value and has the meaning dictated by the context (for example, it includes at least the degree of error associated with the measurement of the particular quantity). When used in the context of a range, the modifier "about" should also be considered as disclosing the range defined by the absolute values of the two endpoints. For example, the range "from about 2 to about 4" also discloses the range "from 2 to 4."

The term "comprising" is used herein as requiring the presence of the named component and allowing the presence of other components. The term "comprising" should be construed to include the term "consisting of", which allows the presence of only the named component, along with any impurities that might result from the manufacture of the named component.

The term "upon" as used herein should be construed as describing the location of a first component relative to the second component. The term should not be construed as requiring that the first component directly contact the second component, although this direct contact is covered by the use of the term.

The present disclosure relates to a photovoltaic device containing a semiconducting bilayer. One of the sublayers includes a phthalocyanine, and the other sublayer includes a different polymorph of the same phthalocyanine.

FIG. 1 is a side cross-sectional view of an exemplary photovoltaic device 100. A substrate 110 is provided. A first electrode, such as anode 120, is located upon the substrate 110. A semiconducting bilayer 140 is then located upon the anode 120. The semiconducting bilayer 140 includes a first sublayer 142 and a second sublayer 144. The first sublayer 142 is located closer in distance to the anode 120 than the second sublayer 144. A junction 145 is formed between the first sublayer 142 and the second sublayer 144. An optional electron blocking layer 130 may be located between the anode 120 and the first sublayer 142, if desired. An electron transporting layer 150 contacts the second sublayer 144 of the semiconducting bilayer 140. An optional hole blocking layer 160 is located on the electron transporting layer 150. Finally, a second electrode, such as cathode 170, is placed upon the substrate 110 and on the hole blocking layer 160. The second sublayer 144 of the semiconducting bilayer 140 is closer to the cathode 170 than the first sublayer 142. It should also be noted that the anode 120 is located closer to the substrate 110 than cathode 170.

Figure 2:
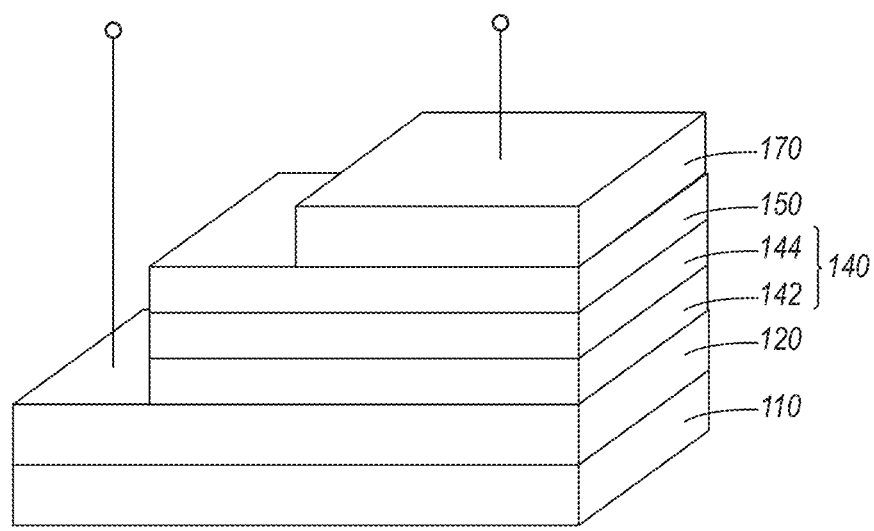
FIG. 2 is a cross-sectional view of an exemplary photovoltaic device of the present disclosure.

As illustrated in FIG. 2, only the substrate 110, anode 120, semiconducting bilayer 140, electron transporting layer 150, and cathode 170 are required to produce a functioning photovoltaic device. However, the additional layers are also helpful in obtaining a highly efficient photovoltaic device. When described in other terms, the semiconducting bilayer 140 is located between the anode 120 and the cathode 170. Also, the electron transporting layer 150 is located between the second sublayer 144 and the cathode 170. The hole blocking layer 160 is located between the second sublayer 144 and the cathode 170 as well. When both an electron transporting layer and hole blocking layer are present, the hole blocking layer 160 is located between the electron transporting layer 150 and the cathode 170.

The first sublayer 142 of the semiconducting bilayer contains a metallophthalocyanine. The second sublayer 144 of the semiconducting bilayer contains a polymorph of the same metallophthalocyanine. Put another way, the first sublayer comprises a first polymorph of the metallophthalocyanine, and the second sublayer comprises a second polymorph of the metallophthalocyanine. The first polymorph and the second polymorph of the metallophthalocyanine are different from each other. A polymorph is a specific crystalline structure of the phthalocyanine, and phthalocyanines may have multiple crystal structures, or in other words more than one polymorphic form. The semiconducting bilayer can also be referred to as heteromorphic.

Metallophthalocyanines are hole transport molecules, completely conjugated, and have exceptional stability and color fastness. Their structure allows bonded species to protrude from the plane, modifying the packing and crystal structure. They generally have high absorption coefficients ($\alpha > 10^5$ $cm^{-1}$) at peak absorbance. They also have strong photoelectrical properties in the NIR range, making them useful in a photovoltaic device. These phthalocyanines can be considered as photon absorbers and electron donors. It should be noted that metallophthalocyanines do not include subphthalocyanines, which have only three benzene rings, whereas metallophthalocyanines have four benzene rings in their structure.

In embodiments, the metallophthalocyanine is of Formula (I):

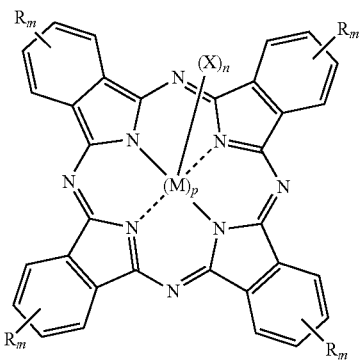

Formula (I)

wherein M is a divalent, trivalent, or tetravalent metal atom; X is hydroxyl or halogen, and n is an integer from 0 to 2, or $(X)_n$ is =O (i.e. a double-bonded oxygen atom, also referred to as "oxo"); each m independent represents the number of R substituents on the phenyl ring, and is independently an integer from 0 to 6; each R is independently selected from the group consisting of halogen, alkyl, substituted alkyl, alkoxy, substituted alkoxy, phenoxy, phenylthio, aryl, substituted aryl, heteroaryl, —CN, and —NO$_2$; and p is 0 or 1.

The term "alkyl" refers to a radical composed entirely of carbon atoms and hydrogen atoms which is fully saturated and of the formula $C_nH_{2n+1}$. The alkyl radical may be linear, branched, or cyclic.

The term "alkoxy" refers to an alkyl radical which is attached to an oxygen atom, i.e. —O—$C_nH_{2n+1}$.

The term "aryl" refers to an aromatic radical composed entirely of carbon atoms and hydrogen atoms. When aryl is described in connection with a numerical range of carbon atoms, it should not be construed as including substituted aromatic radicals. For example, the phrase "aryl containing from 6 to 10 carbon atoms" should be construed as referring to a phenyl group (6 carbon atoms) or a naphthyl group (10 carbon atoms) only, and should not be construed as including a methylphenyl group (7 carbon atoms).

The term "heteroaryl" refers to an aromatic radical containing at least one heteroatom replacing a carbon atom in the radical. The heteroatom is generally nitrogen, oxygen, or sulfur.

The term "substituted" refers to at least one hydrogen atom on the named radical being substituted with another functional group, such as halogen, —CN, —NO$_2$, —COOH, and —SO$_3$H. An exemplary substituted alkyl group is a perhaloalkyl group, wherein one or more hydrogen atoms in an alkyl group are replaced with halogen atoms, such as fluorine, chlorine, iodine, and bromine.

Generally, the alkyl and alkoxy groups each independently contain from 1 to 30 carbon atoms. Similarly, the aryl groups independently contain from 6 to 30 carbon atoms.

In certain embodiments, the divalent metal atom M may be selected from the group consisting of copper, zinc, magnesium, tin, lead, nickel, cobalt, antimony, iron, and manganese. The trivalent metal atom M may be selected from the group consisting of indium(III), gallium(III), and aluminum(III). The tetravalent metal atom M may be selected from the group consisting of vanadium(IV) and titanium(IV).

Exemplary metallophthalocyanines include indium chloride phthalocyanine (ClInPc), aluminum chloride phthalocyanine (ClAlPc), gallium chloride phthalocyanine (ClGaPc), vanadium oxide phthalocyanine (VOPc), titanium oxide phthalocyanine (TiOPc), and copper phthalocyanine (CuPc). When p is 0, the compound is dihydrogen phthalocyanine (H$_2$Pc). These metallophthalocyanines are illustrated here as Formulas (1)-(7).

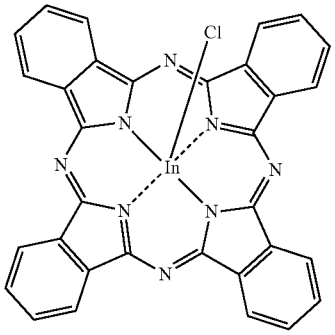

Formula (1): ClInPc

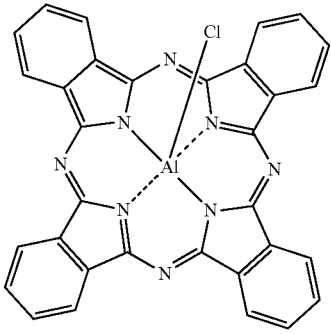

Formula (2): ClAlPc

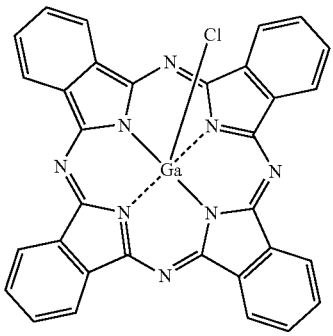

Formula (3): ClGaPc

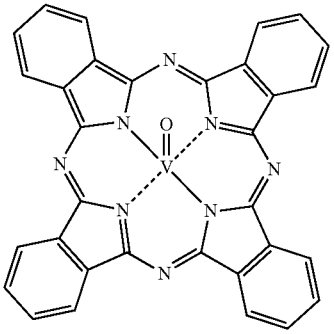

Formula (4): VOPc

-continued

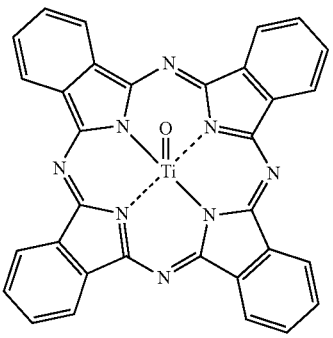

Formula (5): TiOPc

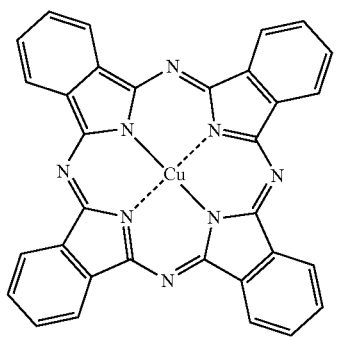

Formula (6): CuPc

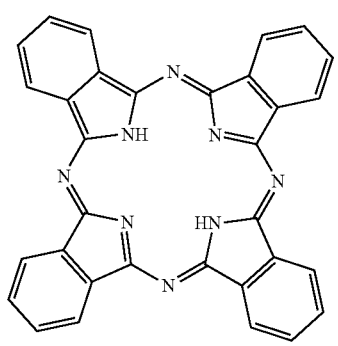

Formula (7): H₂Pc

In particular embodiments, the metallophthalocyanine is indium chloride phthalocyanine. ClInPc has one of the highest open circuit voltages of any metallophthalocyanine. In other embodiments, the phthalocyanine is a metallophthalocyanine, where p=1.

The absorption profiles of the two polymorphic forms of the metallophthalocyanine complement each other, resulting in improved current generation while retaining a voltage closer to that of devices that use only one of the polymorphic forms. Integrating a bilayer of polymorphs of the same material also reduces the number of necessary raw materials. This heteromorphic structure also allows for optimal compromises between desirable properties of distinct polymorphs and allows for the fabrication of devices with a full spectrum of characteristics within the intermediary range of the properties of single phase materials.

The free charge is generated at the junction between the semiconducting bilayer and the electron transporting layer. The semiconducting bilayer itself acts as a hole transporting layer, so that the holes and electrons proceed to their respective electrodes.

Generally, the semiconducting bilayer is made using the same coating composition for both sublayers. The coating composition contains the metallophthalocyanine in the form of the second polymorph. The first sublayer is deposited, and then subjected to a chemical treatment that converts the metallophthalocyanine into the first polymorph. The second sublayer is then deposited (and is not subjected to the chemical treatment).

It is generally not desirable to subject the second sublayer to the chemical treatment instead of the first sublayer. In particular, it is easy to damage or convert the first sublayer when using the chemical treatment on the second sublayer. Changing the polymorph of the first sublayer prior to deposition of the second sublayer prevents such contamination between the sublayers. In addition, certain chemical treatments of the first sublayer result in a texturing of the surface of the first sublayer, improving the interfacial area between the first and second sublayers.

In this regard, the first sublayer is deposited in a thickness that is great enough so that there is still a continuous film after the chemical treatment. In the case of a thin film (approximately 2 nm or less), the film may aggregate into isolated crystallites, leaving holes in the film. This is undesirable. Herein, sublayers of the semiconducting bilayer are produced from compositions and processes which produce continuous films.

In embodiments, the first sublayer of the semiconducting bilayer has a thickness of from at least 3 nanometers. The second sublayer of the semiconducting bilayer may have a thickness of at least 3 nanometers. The entire semiconducting bilayer may have a thickness of at least 6 nanometers.

The surface roughness of the first sublayer, at the junction 145 between the two sublayers, is determined by the root mean square (rms) method. Briefly, the surface roughness is measured at several points at the junction. The reported surface roughness is the square root of the arithmetic mean (average) of the squares of the measured values. In embodiments, the junction between the two sublayers has a surface roughness of from 1 nanometer to 6 nanometers.

It should be noted that the two sublayers of the semiconducting bilayer are continuous sublayers. Put another way, the second sublayer of the semiconducting bilayer does not contact the component of the device that is on the other side of the first sublayer. The two sublayers are discrete continuous films. It is also contemplated that the surface roughness at the junction 145 between the two sublayers also carries through the second sublayer, so that the junction between the second sublayer and the electron transporting layer also has a surface roughness.

Several different metallophthalocyanines are known to undergo polymorphic changes when chemically treated. Several different chemical treatments can be used to change the metallophthalocyanine from one polymorph to another polymorph. One method is by solvent treatment. Solvent vapor exposure, for example to vapors of tetrahydrofuran (THF), has been shown to modify the structure and properties of several moieties of metallophthalocyanines. Similarly, several metallophthalocyanines are easily converted to different polymorphs. Solvent allows swelling and relaxation of the metallophthalocyanine film, resulting in highly photosensitive and dimorphic structures. This also extends the absorption profile of some polymorphs beyond 900 nm. Another method is thermal treatment, with changes to crystal structure due to varying temperatures and annealing times.

The presence of different polymorphs of the metallophthalocyanines in the two sublayers of the semiconducting bilayer can be confirmed by techniques include X-ray diffraction (XRD) and other means known in the art.

The sublayers containing the metallophthalocyanine are typically deposited using vacuum physical vapor deposition, which is a common industrial thin-film fabrication technique. Other deposition techniques can include liquid deposition, such as spin coating, dip coating, blade coating, rod coating, screen printing, stamping, and ink jet printing, as well as other conventional processes known in the art.

The heteromorphic bi-layer structure allows for greater photon absorption due to the complementary absorption profile of the two polymorphs of the metallophthalocyanine, and also has an improved interfacial area between the layers. The interface between the two bilayers is improved due to solvent texturing of the first bilayer during solvent treatment. The second bilayer retains the surface roughness of the first bilayer. The first bilayer is deposited thickly enough that there is still a continuous film after solvent treatment. The result is two distinct films of the metallophthalocyanine in two polymorphic forms.

The substrate 110 of the photovoltaic device supports the other components of the photovoltaic device. The substrate should also be optically transparent in at least the NIR range of the spectrum, to allow light to pass through and contact the semiconducting bilayer. In embodiments, the substrate is composed of materials including, but not limited to, glass, silicon, or a plastic film or sheet. For structurally flexible devices, plastic substrate, such as for example polyester, polycarbonate, polyimide sheets and the like may be used. The thickness of the substrate may be from about 10 micrometers to over 10 millimeters with an exemplary thickness being from about 50 micrometers to about 5 millimeters, especially for a flexible plastic substrate and from about 0.5 to about 10 millimeters for a rigid substrate such as glass or silicon.

The first electrode 120 and the second electrode 170 are composed of an electrically conductive material. Exemplary materials suitable for the electrodes include aluminum, gold, silver, magnesium, calcium, chromium, nickel, platinum, indium tin oxide (ITO), zinc oxide (ZnO), poly(3,4-ethylenedioxythiophene):poly(styrene sulfonic acid) (PEDOT:PSS), carbon nanotube, graphene, and the like. One of the electrodes, and in particular the anode 120, is made of an optically transparent material like ITO or ZnO. In specific embodiments, the anode is ITO and the cathode is aluminum. Typical thicknesses for the electrodes are about, for example, from about 40 nanometers to about 1 micrometer, with a more specific thickness being about 40 to about 400 nanometers.

The electron transporting layer 150 is located between the semiconducting bilayer 140 and the cathode 170. This layer is generally made from a material which allows electrons to move efficiently, and may also absorb some light wavelengths. Exemplary materials for the electron transporting layer include $C_{60}$ fullerene, [6,6]-phenyl-$C_{61}$-butyric acid methyl ester (PCBM), $C_{70}$ fullerene, [6,6]-phenyl-$C_{71}$-butyric acid methyl ester (PC[70]BM), or any fullerene derivative. The electron transporting layer may have a thickness of from about 5 nanometers to about 100 nanometers.

An electron blocking layer 130 may be present between the anode 120 and the semiconducting bilayer 140. This layer prevents recombination at the anode by inhibiting the movement of electrons to the anode. Exemplary materials include poly(3,4-ethylenedioxythiophene):poly(styrene sulfonic acid) (PEDOT:PSS), $MoO_3$, and $V_2O_5$. The electron blocking layer may have a thickness of from about 1 nanometers to about 100 nanometers.

A hole blocking layer 160 may also be located between the electron transporting layer 150 and the cathode 170. Exemplary hole blocking materials for this layer include bathocuproine (BCP), lithium fluoride, and bathophenanthroline. The hole blocking layer may have a thickness of from about 0.1 nanometers to about 100 nanometers.

The following examples illustrate organic photovoltaic devices made according to the methods of the present disclosure. The examples are merely illustrative and are not intended to limit the present disclosure with regard to the materials, conditions, or process parameters set forth therein. All parts are percentages by weight unless otherwise indicated.

EXAMPLES

Example 1

An indium tin oxide (ITO) coated aluminosilicate glass substrate (50 mm×50 mm) was provided. The ITO was present in an amount sufficient to achieve a sheet resistance of 15 Ω/sq. The substrate cleaning procedure included washing with soap solution, de-ionized water, methanol, isopropanol, and then UV-ozone exposure. Substrates were transferred to a multiboat, multimask thermal evaporator for deposition. A vacuum of less than $4 \times 10^{-4}$ Pa was reached before material evaporation commenced.

A semiconducting layer of indium chloride phthalocyanine (ClInPc) was deposited by vacuum physical vapor deposition upon the ITO layer. The semiconducting layer had a thickness of 16 nanometers. No solvent treatment was performed on the semiconducting layer. An electron transporting layer of $C_{60}$ was deposited (30 nm thickness), followed by a hole blocking layer of bathocuproine (BCP) (10 nm thickness). Finally, an aluminum cathode was deposited to complete the device (50 nm thickness). This device is referred to herein as "untreated."

Example 2

A device was completed similar to Example 1. However, after the semiconducting layer was deposited upon the ITO layer, the structure was transported to an isolated chamber where it was exposed to THF vapor for up to several hours. The remaining layers ($C_{60}$, BCP, aluminum) were then deposited under vacuum as described in Example 1. This resulted in a photovoltaic device having a different polymorph of indium chloride phthalocyanine when compared to Example 1. This device is referred to herein as "fully treated."

Example 3

A device was completed similar to Example 1, except that after the semiconducting layer was deposited upon the ITO layer, a first sublayer of ClInPc was deposited by vacuum physical vapor deposition. The first sublayer had a thickness of 10 nanometers. The structure was transported to an isolated chamber where it was exposed to THF vapor for up to several hours. A second sublayer of ClInPc was then deposited under vacuum upon the first sublayer. The second sublayer had a thickness of 6 nm. The remaining layers ($C_{60}$, BCP, aluminum) were then deposited under vacuum as described in Example 1. This resulted in a photovoltaic device with a semiconducting bilayer, the two sublayers having different polymorphs of indium chloride phthalocyanine. This device is referred to herein as "heteromorphic."

Comparison

Examples 1-3 provided different devices to compare the efficiency of the photovoltaic device with two different polymorphs against devices having only one of the polymorphs. It should be noted that the dimensions and thicknesses of the various layers were the same, so the resulting electrical properties is due to this combination of polymorphs.

Devices were illuminated through the ITO electrode with 100 mW/cm$^2$ simulated sunlight using an Oriel 96000 solar simulator with an AM1.5G spectral filter. Input power was monitored with a Newport 818-UV/CM detector and Newport 1830-C optical power meter. A Keithley 238 source-measure unit and PC collected J-V data. The active device area was 7 mm$^2$ defined by a shadow mask.

External Quantum Efficiency (EQE) measurements were performed using a calibrated monochromator from Photon Technology International and a Keithley 6485 picoammeter, measuring short circuit current as a function of incident wavelength. This property measures a device's electrical sensitivity to light, and provides information on the current that a given device will produce when illuminated by a particular wavelength.

Figure 3:
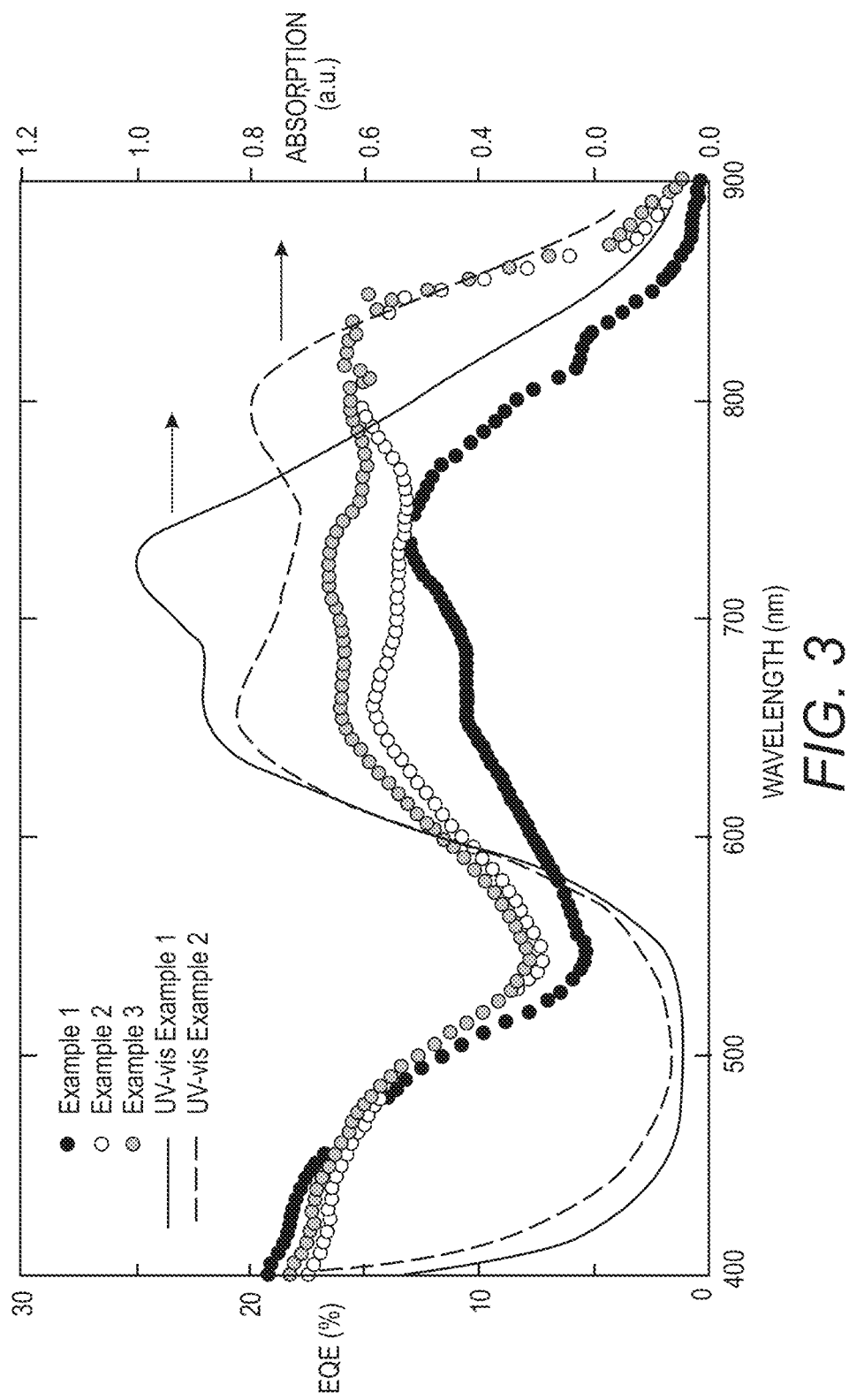
FIG. 3 is a graph showing the external quantum efficiency and the absorption versus the wavelength for three different devices comparing the present disclosure to other devices.

The external quantum efficiency (EQE) of the three Examples is shown in FIG. 3. As seen here, Example 3 mirrors the absorption profiles of Examples 1 and 2.

Also shown on FIG. 3 is the absorption profile of Examples 1 and 2 (the untreated and fully treated devices), shown here as absorbance vs. wavelength. These two lines show the different and complementary absorption profiles for the two polymorphs. Their combination results in the energy of a broader portion of the solar spectrum being absorbed, and a consequent improvement in the performance of the photovoltaic device. The fully treated device of Example 2 showed a distinct broadening of the absorption range to near-infrared wavelengths after exposure to THF vapors.

The EQE for Example 3 has a higher value over a broader range as a result of the combination. This indicates that the device of Example 3 is able to capture more light than Examples 1 and 2. Current generation was improved within the Q-band absorption range in Examples 2 and 3 (solvent treated). Example 2 showed an extended absorption spectrum, i.e. a broader range of higher absorption between approximately 600 nm to 900 nm, when compared to Example 1, and generated current at wavelengths beyond 850 nm. The EQE of Example 3 also showed a heightened central peak at 725 nm, indicating a contribution to the electrical current from the second sublayer. This region is typically a valley in the absorption profile of Example 2.

Figure 4:
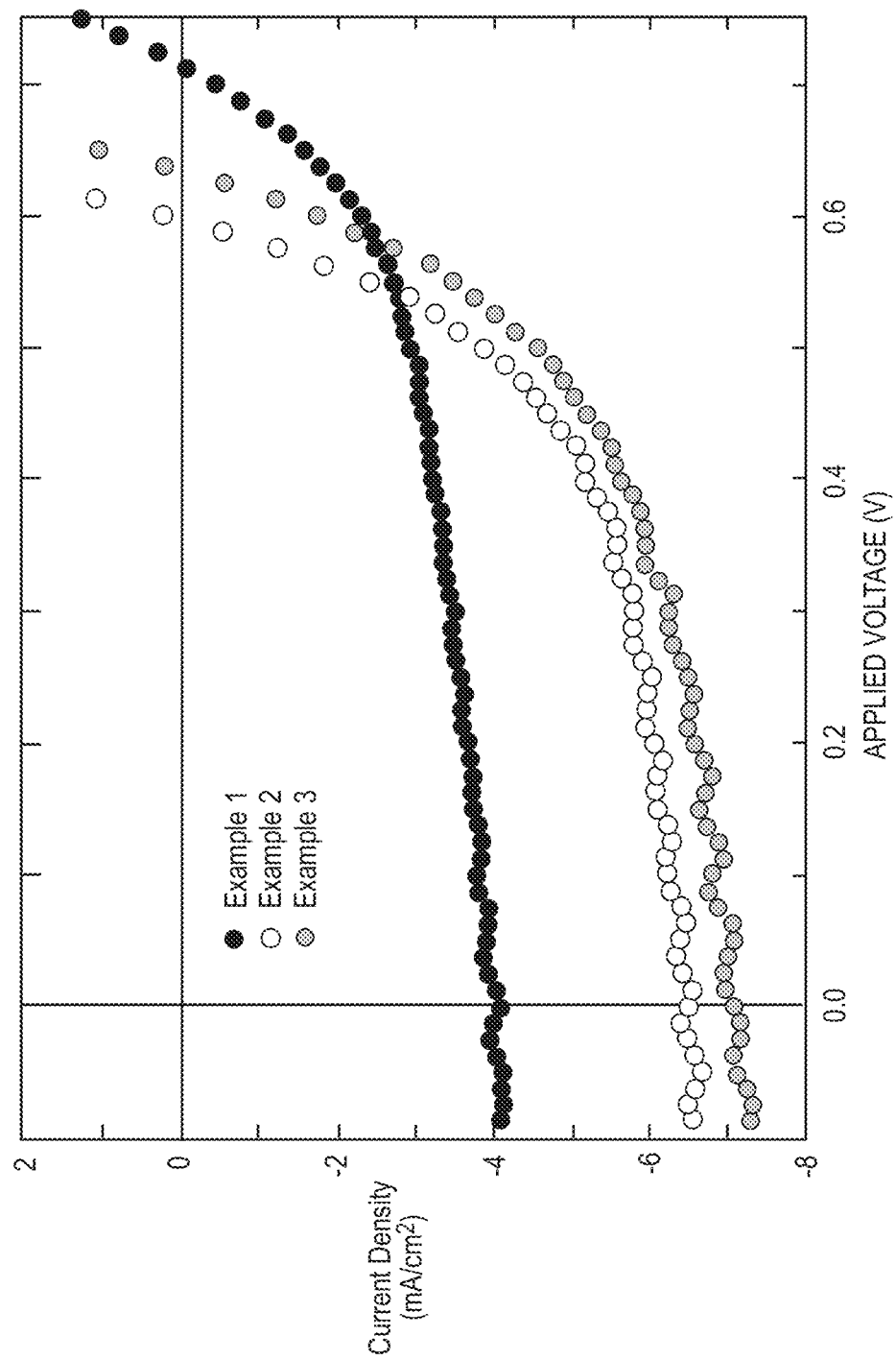
FIG. 4 is a graph showing the current density versus the applied voltage for the three devices of FIG. 3.

FIG. 4 is a graph showing the current density versus the applied voltage for the three Examples. Current density was calculated by dividing the current by the active area. The open circuit voltage $V_{OC}$ (when the current is zero) of Example 3 was increased relative to that of Example 2, though both were lower than Example 1 (untreated). However, this drop was accompanied by a considerable increase in $J_{SC}$. The short circuit current $J_{SC}$ is the current flow when the voltage is zero. As seen here, Example 3 (the heteromorphic device) had the best $J_{SC}$ value (as determined by the greatest difference from zero). The $J_{SC}$ improved from a $J_{SC}$ of 4.08 milliamperes/cm$^2$ in Example 1 to a $J_{SC}$ of 6.16 mA/cm$^2$ in Example 2, and to a $J_{SC}$ of 7.09 mA/cm$^2$ in Example 3. This was attributed to the increased interfacial area between the two sublayers, and to improved photoelectrical activity at longer wavelengths. In other words, in Example 3 the $J_{SC}$ was improved without compromising the $V_{OC}$.

This is relevant because the power conversion efficiency is the efficiency obtained by the device at its optimal load. In general, the higher the short circuit current and the higher the open circuit voltage, the better. This is because power is determined by the formula: P=IV. This provided an optimal J-V response in Example 3 which was superior to that of Examples 1 and 2.

The overall power conversion efficiency was 1.50% for Example 1, 2.14% for Example 2, and 2.35% for Example 3. This increase in efficiency is greater than would be expected from a simple combination of Examples 1 and 2, and demonstrated the benefits of this structure. Since thin vacuum deposited films typically conform to the structure of the underlying layer, it can be assumed that in Example 3, there was improved interfacial contact between (a) the first and second sublayers of the semiconducting bilayer, and (b) the second sublayer and the electron transporting layer of $C_{60}$.

Example 4

A thin film of ClInPc was deposited upon two glass substrates. The thin film on the first glass substrate was not exposed to THF vapor. The thin film on the second glass substrate was exposed to THF vapor. X-ray diffraction spectra of the two films were then taken.

Figure 5:
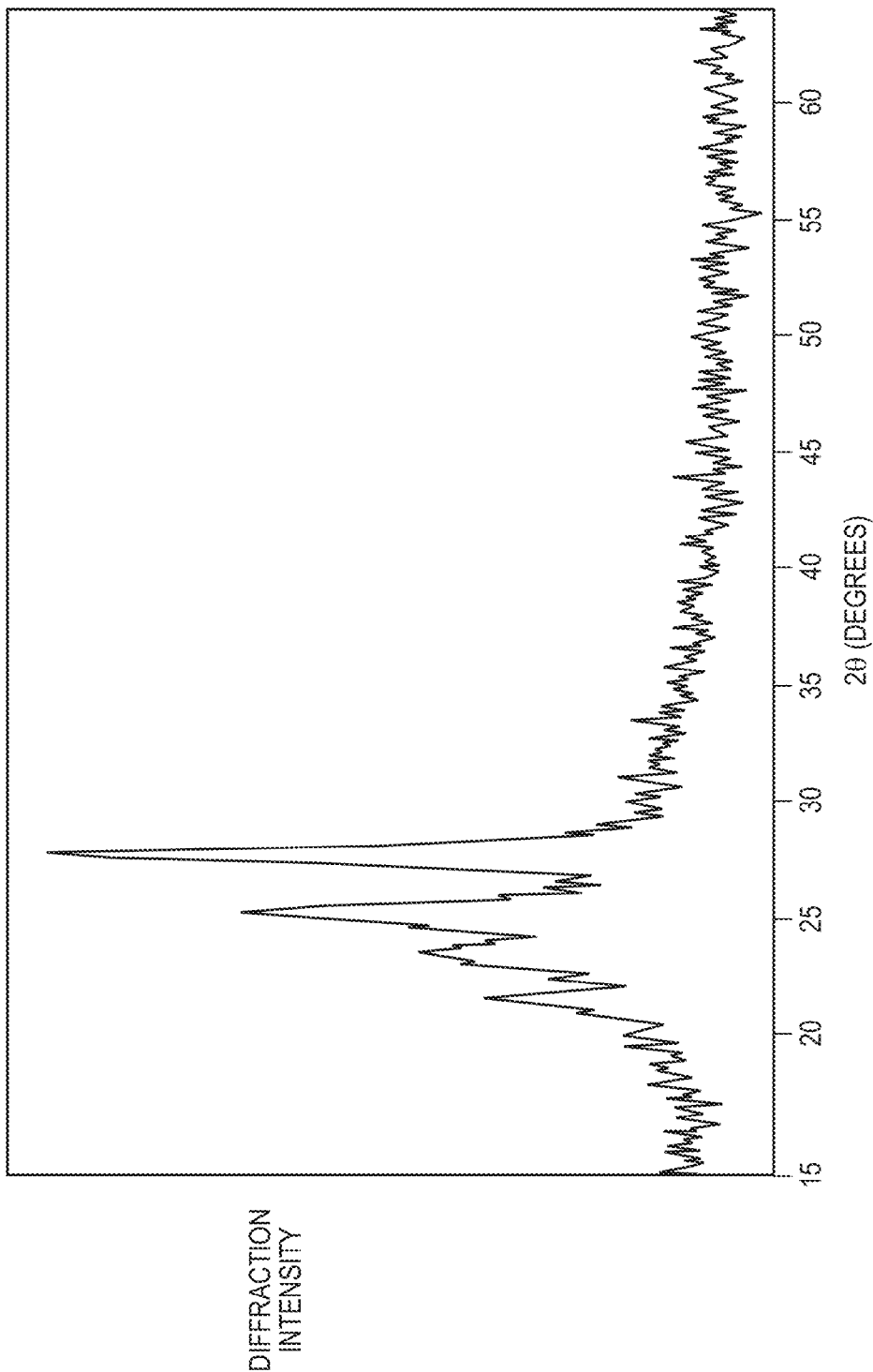
FIG. 5 shows the X-ray diffraction spectrum for a THF-treated film after the spectrum for a non-treated film has been subtracted.

FIG. 5 shows the X-ray diffraction spectrum for the THF-treated film after the spectrum for the non-treated film has been subtracted. A distinct diffraction pattern is seen, indicating a degree of crystallinity in the film and a new and different phase (i.e. polymorph). The peaks were located, in decreasing order of intensity, at 27.7°, 25.1°, 23.4°, and 21.6°.

The present disclosure has been described with reference to exemplary embodiments. Obviously, modifications and alterations will occur to others upon reading and understanding the preceding detailed description. It is intended that the present disclosure be construed as including all such modifications and alterations insofar as they come within the scope of the appended claims or the equivalents thereof.

The invention claimed is:

1. A photovoltaic device, comprising:

a substrate;

a first electrode upon the substrate;

a second electrode upon the substrate;

a semiconducting bilayer including a first continuous sublayer contacting a second continuous sublayer, the semiconducting bilayer being located upon the substrate between the first electrode and the second electrode, the first sublayer being closer in distance to the first electrode than the second sublayer, wherein a junction between the first sublayer and the second sublayer of the semiconducting bilayer has a root mean square surface roughness of from 1 nanometer to 6 nanometers;

an electron transporting layer between the second sublayer and the second electrode;

wherein the first sublayer comprises a metallophthalocyanine; and wherein the second sublayer comprises a different polymorph of the same metallophthalocyanine; and wherein the first sublayer has a thickness of at least 3 nanometers and the second sublayer has a thickness of at least 3 nanometers, and the first sublayer and the second sublayer together have a thickness of at most 16 nanometers.

2. The photovoltaic device of claim 1, wherein the metallophthalocyanine is of Formula (I):

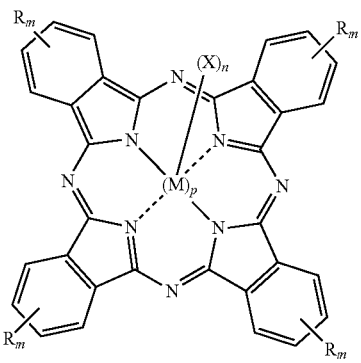

Formula (I)

wherein M is a divalent, trivalent or tetravalent metal atom; X is hydroxyl or halogen, and n is an integer from 0 to 2, or $(X)_n$ is =O; each m independent represents the number of R substituents on the phenyl ring, and is independently an integer from 0 to 6; each R is independently selected from the group consisting of halogen, alkyl, substituted alkyl, alkoxy, substituted alkoxy, phenoxy, phenylthio, aryl, substituted aryl, heteroaryl, —CN, and —$NO_2$; and p is 0 or 1.

3. The photovoltaic device of claim 1, wherein the metallophthalocyanine is indium chloride phthalocyanine.

4. The photovoltaic device of claim 1, wherein the first electrode comprises indium tin oxide, fluorine tin oxide, doped zinc oxide, poly(3,4-ethylenedioxythiophene):poly(styrene sulfonic acid) (PEDOT:PSS), carbon nanotube, or graphene.

5. The photovoltaic device of claim 1, wherein the second electrode comprises aluminum, silver, magnesium, calcium, or alloys thereof.

6. The photovoltaic device of claim 1, wherein the electron transporting layer comprises $C_{60}$ fullerene, [6,6]-phenyl-$C_{61}$-butyric acid methyl ester (PCBM), $C_{70}$ fullerene, [6,6]-phenyl-$C_{71}$-butyric acid methyl ester, or a fullerene derivative.

7. The photovoltaic device of claim 1, further comprising a hole blocking layer located between the electron transporting layer and the second electrode.

8. The photovoltaic device of claim 7, wherein the hole blocking layer comprises bathocuproine, lithium fluoride, or bathophenanthroline.

9. The photovoltaic device of claim 1, further comprising an electron blocking layer between the first electrode and the first sublayer.

10. The photovoltaic device of claim 9, wherein the electron blocking layer comprises poly(3,4-ethylenedioxythiophene):poly(styrene sulfonic acid) (PEDOT:PSS), $MoO_3$, or $V_2O_5$.

11. A photovoltaic device, comprising in sequence:
a substrate;
an anode upon the substrate;
a semiconducting bilayer including a first continuous sublayer contacting a second continuous sublayer, the first sublayer being closer to the anode than the second sublayer, wherein a junction between the first sublayer and the second sublayer of the semiconducting bilayer has a root mean square surface roughness of from 1 nanometer to 6 nanometers;
an electron transporting layer upon the second sublayer;
a hole blocking layer upon the electron transporting layer; and
a cathode upon the hole blocking layer;
wherein the first sublayer comprises a first polymorph of a trivalent metallophthalocyanine; and
wherein the second sublayer comprises a second polymorph of the trivalent metallophthalocyanine; and
wherein the first sublayer has a thickness of at least 3 nanometers and the second sublayer has a thickness of at least 3 nanometers, and the first sublayer and the second sublayer together have a thickness of at most 16 nanometers.

12. The photovoltaic device of claim 11, wherein the metallophthalocyanine is indium chloride phthalocyanine.

13. The photovoltaic device of claim 11, further comprising an electron blocking layer between the anode and the first semiconducting layer.

14. The photovoltaic device of claim 13, wherein the electron blocking layer comprises poly(3,4-ethylenedioxythiophene):poly(styrene sulfonic acid) (PEDOT:PSS), $MoO_3$, or $V_2O_5$.

15. The photovoltaic device of claim 11, wherein the electron transporting layer comprises $C_{60}$ fullerene, [6,6]-phenyl-$C_{61}$-butyric acid methyl ester (PCBM), $C_{70}$ fullerene, [6,6]-phenyl-$C_{71}$-butyric acid methyl ester, or a fullerene derivative.

16. The photovoltaic device of claim 11, wherein the hole blocking layer comprises bathocuproine, lithium fluoride, or bathophenanthroline.

17. A photovoltaic device, comprising in sequence:
an optically transparent substrate;
an indium tin oxide electrode upon the substrate;
a first continuous semiconducting sublayer comprising a first polymorph of indium chloride metallophthalocyanine;
a second continuous semiconducting sublayer comprising a second polymorph of indium chloride metallophthalocyanine;
an electron transporting layer comprising $C_{60}$ fullerene;
a hole blocking layer comprising bathocuproine; and
an aluminum electrode deposited on the hole blocking layer;
wherein the first polymorph is made by depositing a coating composition containing the second polymorph of indium chloride metallophthalocyanine and then solvent treating the deposited composition to convert the second polymorph into the first polymorph and to texture the first sublayer, resulting in a root mean square surface roughness of from 1 nanometer to 6 nanometers at a junction between the first sublayer and the second sublayer; and
wherein the first sublayer has a thickness of at least 3 nanometers and the second sublayer has a thickness of at least 3 nanometers, and the first sublayer and the second sublayer together have a thickness of at most 16 nanometers.

* * * * *